United States Patent [19]

Wu et al.

[11] Patent Number: 5,670,814

[45] Date of Patent: Sep. 23, 1997

[54] ELECTROSTATIC DISCHARGE PROTECTION CIRCUIT TRIGGERED BY WELL-COUPLING

[75] Inventors: Chau-Neng Wu, Kaoshiung Hsien; Ming-Dou Ker, Kuei-Jen Hsiang, both of Taiwan

[73] Assignee: Winbond Electronics Corporation, Taiwan

[21] Appl. No.: 655,076

[22] Filed: Jun. 3, 1996

[51] Int. Cl.$^6$ .............................. H01L 22/62; H02H 3/20; H02H 3/24

[52] U.S. Cl. ................... 257/360; 257/355; 257/356; 257/357; 257/358; 361/90; 361/91

[58] Field of Search ........................... 257/355–358, 257/360, 363, 172, 107, 173; 361/90, 91; 327/432, 438, 439, 440, 453, 465, 470

*Primary Examiner*—Wael Fahmy
*Assistant Examiner*—Fetsum Abraham
*Attorney, Agent, or Firm*—Rabin, Champagne & Lynt, P.C.

[57] ABSTRACT

An electrostatic discharge (ESD) protection circuit is disposed between a metal pad and a circuit ground, wherein the pad may be an input pad or an output pad. The circuit includes a thick oxide device, a capacitor, and an NMOS transistor. The thick oxide device is configured with its drain and source connected to the pad and circuit ground, respectively. The gate of the thick oxide device is tied to the pad, and the oxide device bulk is connected to the drain of the NMOS transistor. The NMOS transistor is configured with its source connected to the circuit ground and its gate controlled by a power rail. The capacitor is connected between the pad and the bulk of the thick oxide device. The bulk of the device is constructed by a P-well region formed in a substrate. The capacitor is formed between the pad and a polysilicon layer just therebelow, without consuming extra layout area. When a positive-to-ground ESD pulse is conducted to the pad, the capacitor couples the ESD voltage to the well region and turns on the thick oxide device to bypass the ESD stress. Moreover, a diode is connected between the pad and circuit ground by its cathode and anode, respectively, to bypass a negative-to-ground ESD pulse. The diode can be an extra component or a built-in PN junction. In normal operation, the NMOS transistor is powered on and connects the bulk of the device to the circuit ground without floating of the P-well region.

7 Claims, 5 Drawing Sheets

ELECTROSTATIC DISCHARGE PROTECTION CIRCUIT TRIGGERED BY WELL-COUPLING

BACKGROUND OF THE INVENTION

1. Field of the Invention

The invention generally relates to a technique for protection against electrostatic discharge damage of integrated circuits. More particularly, the invention relates to an electrostatic discharge protection circuit that is triggered via well-coupling.

2. Description of the Related Art

Electrostatic discharge, hereinafter "ESD," is a common phenomenon that occurs during handling of semiconductor integrated circuit ("IC") devices. An electrostatic charge may accumulate for various reasons and produce potentially destructive effects on an IC device. Damage typically can occur during a testing phase of an IC's fabrication or during assembly of the IC onto a circuit board, as well as during use of equipment into which the IC has been installed. Damage to a single IC due to poor ESD protection in an electronic device can partially or sometimes completely hamper its functionality. ESD protection for semiconductor ICs is, therefore, a reliability issue.

ESD stress models are based on the reproduction of typical discharge pulses to which the IC may be exposed during manufacture or handling. Three standard models, known as the Human Body Model (HBM), Machine Model (MM), and Charged Device Model (CDM) have been developed. The human-body model is set forth in U.S. Military Standard MIL-STD-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded while being handled.

Referring to FIGS. 1 and 2, circuit diagrams of ESD protection circuits conventionally used with an input pad and an output pad of an IC package are schematically depicted. As shown in FIG. 1, an NMOS transistor $M_1$ is utilized to protect an internal circuit 6 from ESD stress that may appear at the input pad 5. The gate, source, and bulk of the NMOS transistor $M_1$ are all tied to circuit ground $V_{SS}$. The drain of the NMOS transistor $M_1$ is connected to the input pad 5. As shown in FIG. 2, an output buffer consisting of an NMOS transistor $M_2$ and a PMOS transistor $M_3$ is employed to protect the internal circuit 6 from ESD damage at the output pad 7. Accordingly, gates of the NMOS and PMOS transistors are both coupled to the internal circuit 6, drains of which are tied together and to the output pad 7. Moreover, the source and bulk of the NMOS $M_2$ are tied together and to circuit ground $V_{SS}$. The source and bulk of the PMOS transistor $M_3$ are tied together and to a $V_{DD}$ power rail.

However, in light of the trend toward submicron scale IC fabrication, NMOS transistor vulnerability to ESD stress has been greatly reduced due to advanced processes, such as using lightly-doped drain (LDD) structures and clad silicide diffusions. Moreover, those devices with higher ESD immunity, such as a diode or a thick oxide device $M_4$ shown in FIG. 3, have a triggering voltage higher than the breakdown voltage of a submicron-NMOS transistor. Accordingly, those devices are suited to operate in providing protection at the input pad 5, but are useless in providing protection at the output pad 7. Consequently, there is a need for an ESD protection circuit that can be used at any location of an IC likely to introduce ESD to the internal circuit, such as at an input pad or an output pad, in order to protect the internal circuit from ESD damage.

SUMMARY OF THE INVENTION

The invention is an ESD protection circuit that can protect an internal circuit from ESD damage at input pads or output pads. The same circuit design can be used in different configurations to protect the internal circuit from ESD damage at each of the above locations.

Moreover, the invention is an ESD protection circuit used to cause an ESD current to bypass the internal circuit in a uniformly distributed flow, thereby minimizing local heating of the protection circuit.

The invention achieves the above-identified advantages by providing an electrostatic discharge protection circuit, fabricated in an IC package. The IC package, according to the disclosed embodiment, includes an N-type semiconductor substrate, a first P-well region, and a second P-well region. The P-well regions are spaced apart and are formed in the substrate. At least one contact region is formed in the first P-well region and an isolating structure is formed overlying one side of the substrate. A polysilicon layer is formed on the isolating structure and is coupled to the contact region and a dielectric layer is formed overlying the polysilicon layer. A metal pad is formed on the dielectric layer just over the polysilicon layer, creating a capacitor therebetween, which is utilized to couple an ESD voltage to the first P-well region whenever an ESD stress appears at the pad. A first heavily-doped N-type region is formed in the first P-well region and is coupled to the pad. At least one second heavily-doped N-type region is formed in the first P-well region, spaced apart from the first heavily-doped N-type region and coupled to circuit ground, wherein the first heavily-doped N-type region, the second heavily-doped N-type region, and the first P-well region constitute a bipolar junction transistor which bypasses ESD stress after the ESD voltage is coupled to the first P-well region through the capacitor. An NMOS transistor is formed in the second P-well region, and includes a source and a drain coupled to the circuit ground and the contact region, respectively, and a gate controlled by a power rail for connecting the first P-well region to the circuit ground while the power rail is powered, to turn on the NMOS transistor.

The circuit includes a thick oxide device having a drain and a gate coupled to the protected circuit and to the potential ESD input. The IC pad is coupled to the bulk of the oxide device by a capacitor. The source of the oxide device is coupled directly to ground, and the bulk is coupled to ground by an NMOS transistor. The gate of the NMOS transistor is controlled by the circuit power source, and the bulk and source are coupled directly to ground. A diode having a grounded anode may be coupled to the protected circuit at a cathode to provide further protection.

BRIEF DESCRIPTION OF THE DRAWINGS

These and other objects, features, and advantages of the invention will become apparent by way of the following detailed description of the preferred but non-limiting embodiments. The description is made with reference to the accompanying drawings, wherein.

DETAILED DESCRIPTION OF THE PREFERRED EMBODIMENTS

Figure 1:
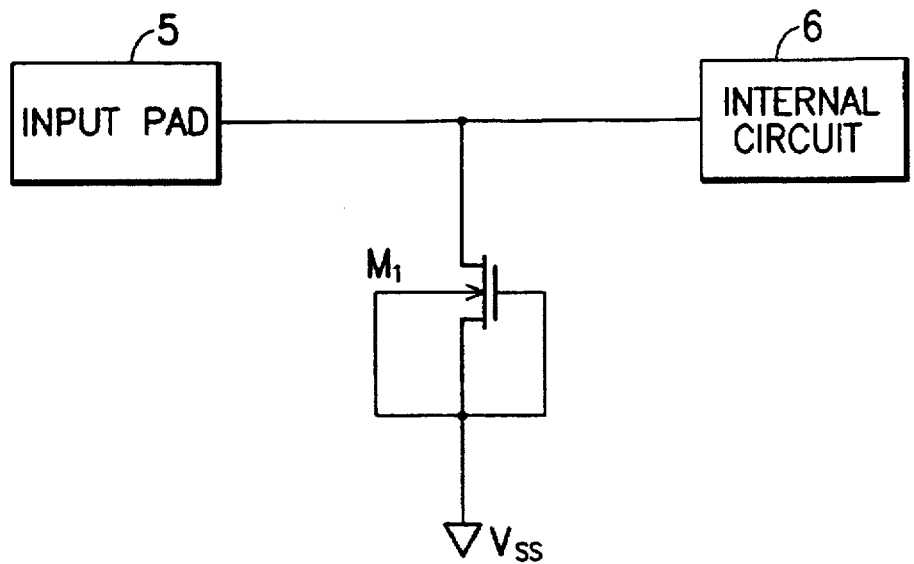
FIG. 1 is a schematic diagram of a conventional ESD protection circuit composed of a NMOS transistor at an input pad.
Figure 2:
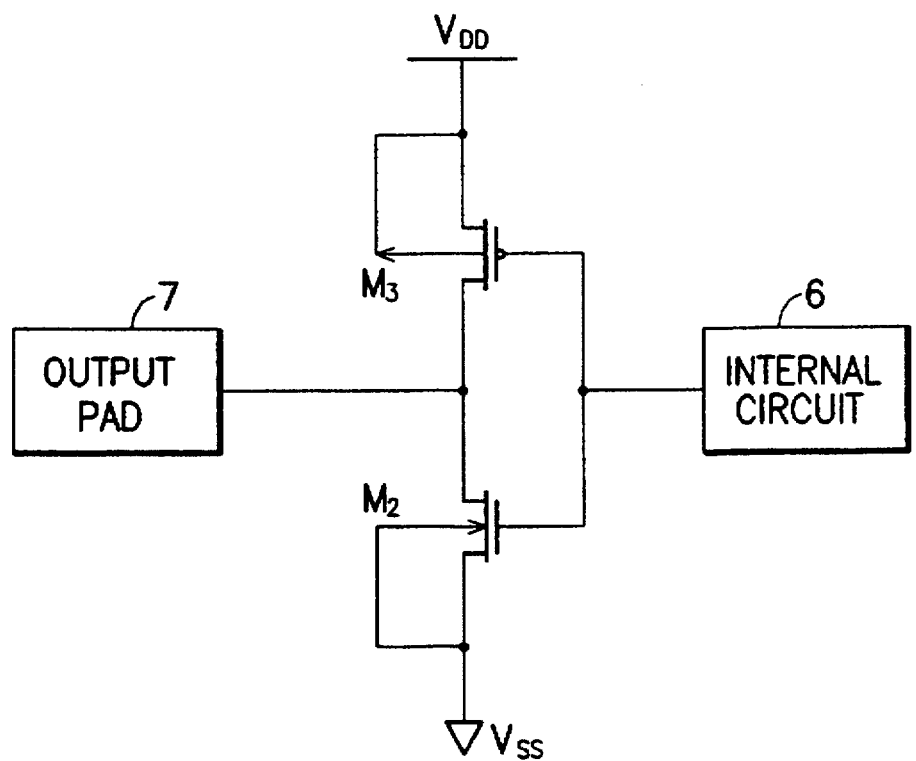
FIG. 2 is a schematic diagram of a conventional ESD protection circuit in the form of an output buffer connected at an output pad.
Figure 3:
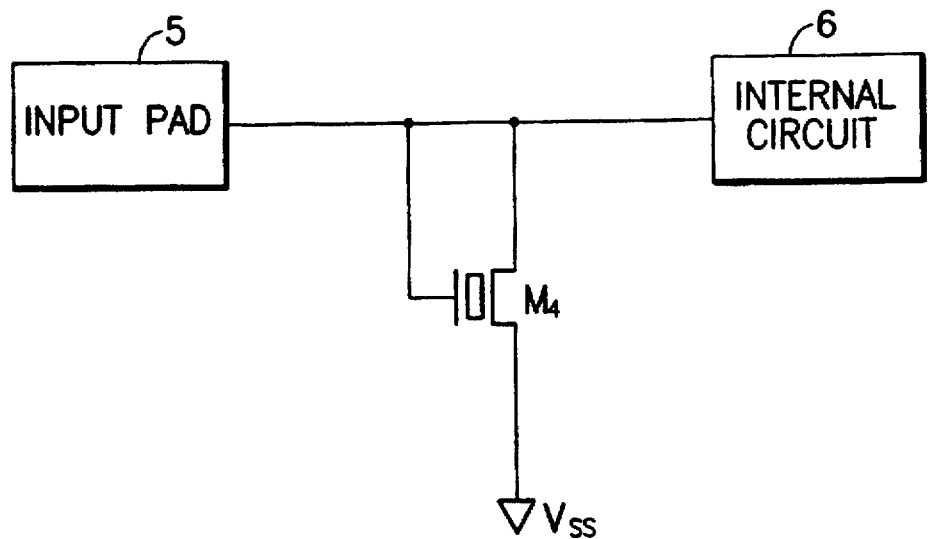
FIG. 3 is a schematic diagram of a conventional ESD protection circuit composed of a thick oxide device at an input pad.
Figure 4:
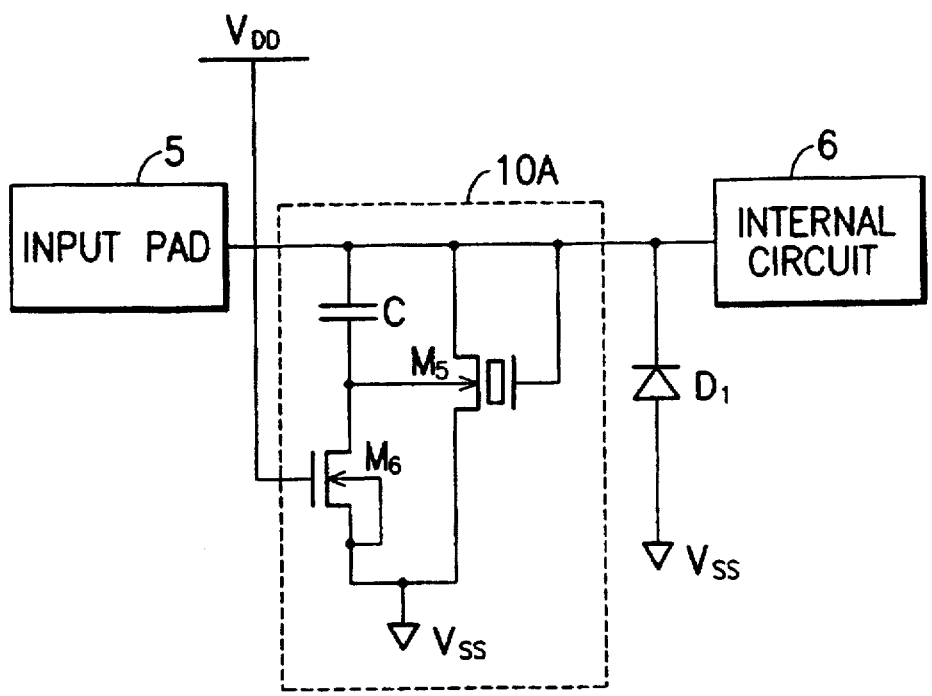
FIG. 4 is a schematic diagram of an ESD protection circuit triggered by well-coupling in accordance with the invention, disposed at an input pad.

Referring to FIG. 4, an ESD protection circuit 10A, in accordance with the invention, is depicted positioned at an input pad 5. The input pad 5 is connected to an internal circuit 6, which is the circuit to be protected from ESD damage. The ESD protection circuit 10A includes a thick oxide device $M_5$, a capacitor C, and an NMOS transistor $M_6$. The thick oxide device $M_5$ is configured with its drain connected the input pad 5 and with its source connected to circuit ground $V_{SS}$. The gate of the thick oxide device $M_5$ is also tied to the input pad 5. The bulk of the thick oxide device $M_5$ is coupled to the drain of the NMOS transistor $M_6$. The NMOS transistor $M_6$ is configured with the gate controlled by a $V_{DD}$ power rail. Moreover, the bulk and source of the NMOS transistor $M_6$ are tied together and to the $V_{SS}$ power rail. The capacitor C is connected between the input pad 5 and the bulk of the device $M_5$. In addition, a diode $D_1$ is connected at its anode to circuit ground $V_{SS}$ and at its cathode to the input pad 5.

Figure 5:
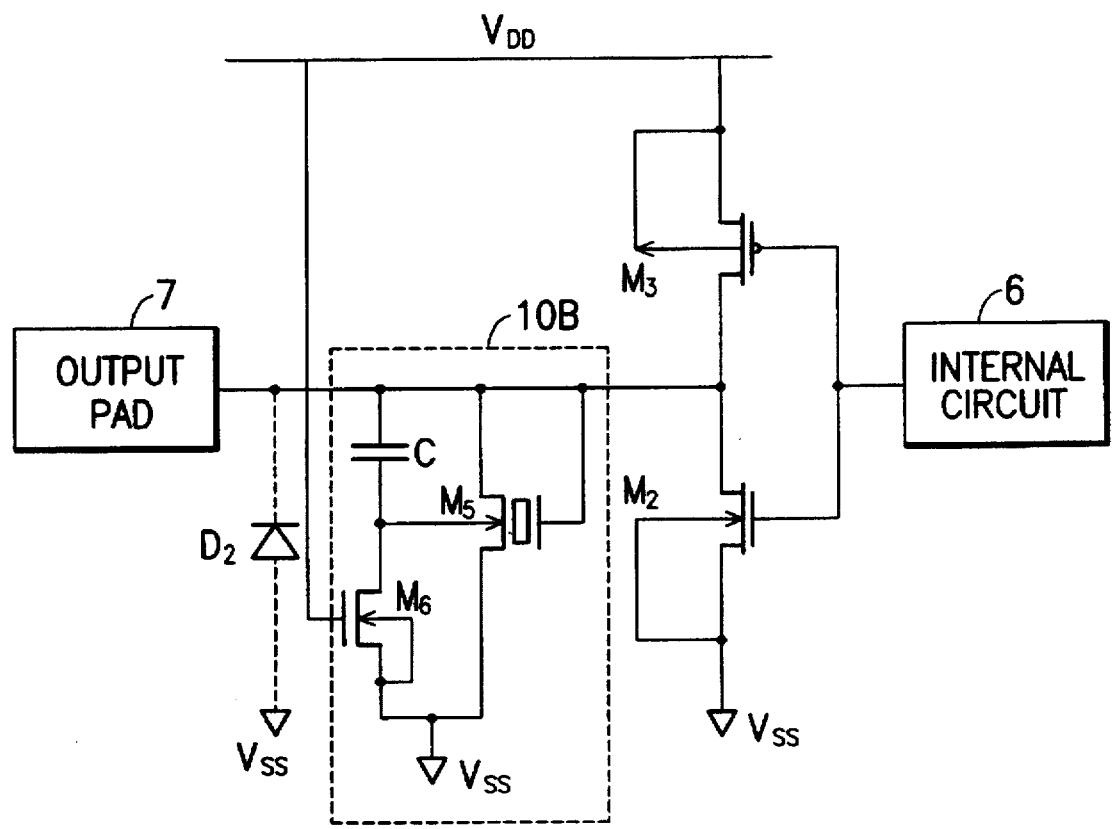
FIG. 5 is a schematic diagram of an ESD protection circuit triggered by well-coupling in accordance with the invention, disposed at an output pad.

Referring to FIG. 5, an ESD protection circuit 10B, in accordance with the invention, of the same structure as ESD protection circuit 10A of FIG. 4, is depicted positioned at an output pad 7. The output pad 7 is coupled by an output buffer to the internal circuit 6. The output buffer comprises a PMOS transistor $M_3$ and an NMOS transistor $M_2$ configured with both drains tied together as an output connection to the output pad 7, and with both gates tied together as a circuit connection, disposed such that the gates are controlled by the internal circuit 6. The source and bulk of the NMOS transistor $M_2$ are tied together and to circuit ground $V_{SS}$, and the source and the bulk of the PMOS transistor $M_3$ are connected together and to the power rail $V_{DD}$. The ESD protection circuit 10B comprises a thick oxide device $M_5$, a capacitor C, and an NMOS transistor $M_6$. The thick oxide device $M_5$ is configured with its drain connected to the output pad 7 and with its source connected to circuit ground $V_{SS}$. The gate of the thick oxide device $M_5$ is also tied to the output pad 7. The bulk of the thick oxide device $M_5$ is connected to the drain of the NMOS transistor $M_6$. The NMOS transistor $M_6$ is configured with the gate controlled by the $V_{DD}$ power rail. Moreover, the bulk and source of the NMOS transistor $M_6$ are tied together and to the $V_{SS}$ power rail. The capacitor C is connected between the output pad 7 and the bulk of the device $M_5$. In addition, a diode $D_2$ is preferably connected at its anode to circuit ground $V_{SS}$ and at its cathode to the output pad 7.

Figure 6:
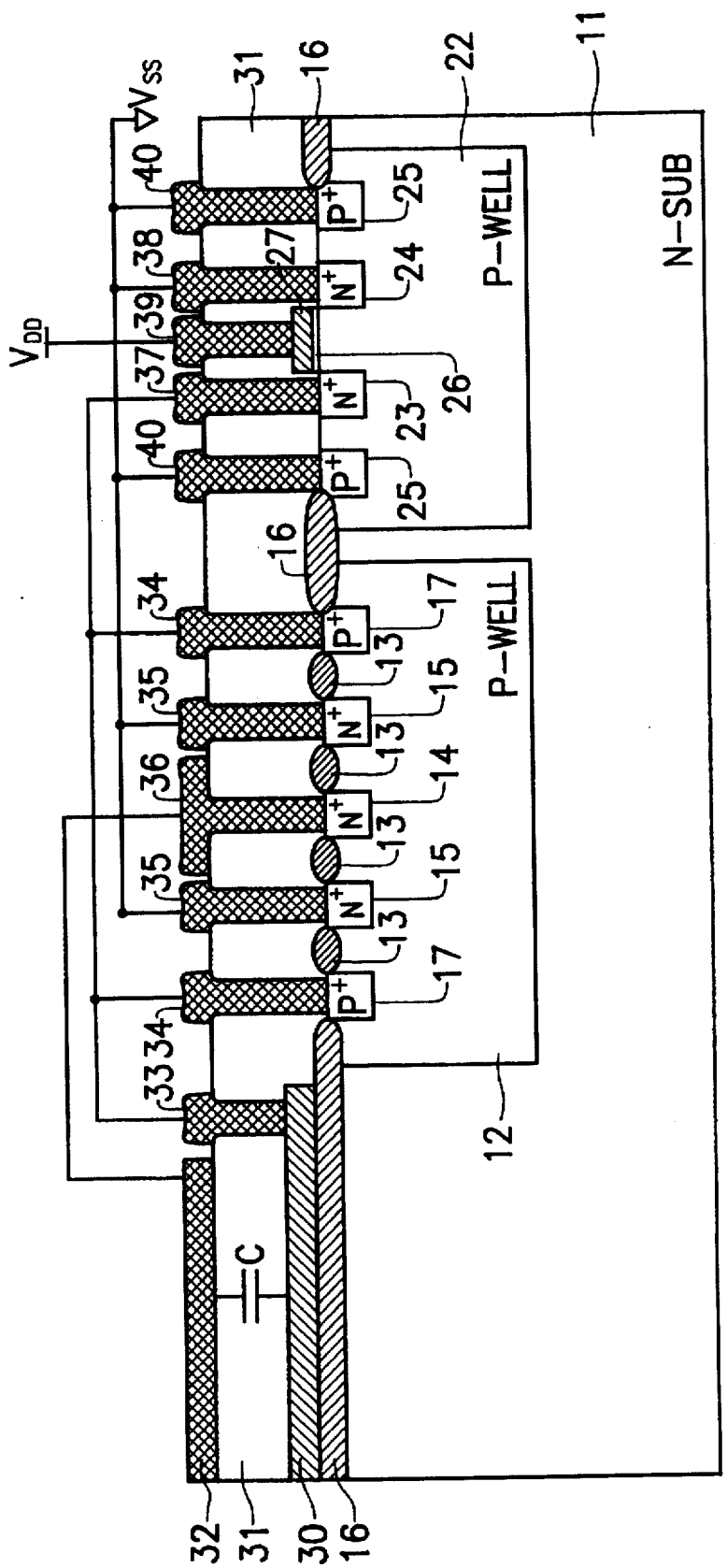
FIG. 6 is a cross-sectional view of one preferred embodiment of the ESD protection circuits according to FIGS. 4 and 5, fabricated onto a semiconductor substrate.

Referring to FIG. 6, one preferred embodiment, in accordance with the invention, of ESD protection circuits 10A and 10B depicted in FIGS. 4 and 5, respectively, as fabricated onto a semiconductor substrate, is illustrated in a cross-sectional view. As shown in the drawing, a first P-well region 12 and a second P-well region 22 are spaced apart and formed in an N-type substrate 11. The thick oxide device $M_5$ and the NMOS transistor $M_6$ are fabricated onto first P-well region 12 and second P-well region 22, respectively. Field oxide portions 13 and 16 are thermally grown, preferably by a LOCOS (local oxidation of silicon) process, overlying a predetermined area of the substrate 11, as isolating structures.

A first heavily-doped N-type region 14 is formed in the first P-well region 12 as the drain terminal of the thick oxide device $M_5$. At least one second heavily-doped N-type region 15 (two second heavily-doped regions are exemplified in FIG. 6) is formed in the first P-well region 12 as the source terminal of the thick oxide device $M_5$. The two second heavily-doped N-type regions 15 shown are symmetric about and spaced apart from the first heavily-doped region 14 by one of the field oxide portions 13. At least one contact region 17 (two contact regions are exemplified in FIG. 6) is formed in the P-well region 12 by implanting P-type impurities therein. Each contact region 17 is spaced apart from the adjacent second heavily-doped region 15 by one of the field oxide portions 13 to form the bulk terminal of the thick oxide device $M_5$.

The NMOS transistor $M_6$ is fabricated onto the second P-well region 22. Accordingly, the drain terminal 23 and source terminal 24 are formed in the second P-well region 22 by implanting N-type impurities therein. A gate dielectric layer 26 is formed to cover the portion of the second P-well region 22 between the drain terminal 23 and the source terminal 24, and a gate 27 is formed on the gate dielectric layer 26. Furthermore, there are contact regions 25 formed in the second P-well region 22 as bulk terminal of the NMOS transistor $M_6$.

A polysilicon layer 30 doped with impurities is formed on the field oxide portion 16. A dielectric layer 31 is deposited to cover the overall surface and then is etched to shape several contact windows in order to expose the polysilicon layer 30, contact regions 17, second heavily-doped N-type region 15 and first heavily-doped N-type regions 14 of the thick oxide device $M_5$. Also, the bulk 25, drain 23, source 24, and gate 27 of the NMOS transistor $M_6$ are exposed through the corresponding contact windows. A metal pad 32, which can be the input pad 5 of FIG. 4 or the output pad 7 of FIG. 5, depending on the configuration in which the circuit of the invention is used, is formed on the dielectric layer 31 above the polysilicon layer 30. Accordingly, the pad 32, the dielectric layer 31, and the polysilicon layer 30 form the capacitor C. The capacitor C is thus formed by the pad 32 and the polysilicon layer 30 therebelow, without consuming extra layout area. In addition, a plurality of metal contacts 33, 34, 35, 36, 37, 38, 39, 40 are formed on the dielectric layer 31 and are connected to the polysilicon layer 30, contact regions 17, second heavily-doped regions 15, first heavily-doped region 14, drain terminal 23, source terminal 24, gate 27, and bulk terminal 25, respectively, through the associated contact windows. Note that the metal contact 36 preferably covers over the field oxide portions 13 on the sides of the first heavily-doped N-type region 14, and functions as the drain terminal of the thick oxide device $M_5$. According to the ESD protection circuits depicted in FIGS.

4 and 5, the pad 32 is electrically coupled to the first heavily-doped N-type region 14 via the metal contact 36. The polysilicon layer 30 is electrically coupled by the metal contacts 33 and 34 to the contact regions 17, and also coupled to the drain terminal 23 of the NMOS transistor $M_6$ via the metal contact 37. The second heavily-doped N-type regions 15 are electrically coupled by the metal contacts 35 to circuit ground $V_{SS}$. Moreover, the source terminal 24 and the bulk terminal 25 are coupled by the metal contacts 38 and 40 to the circuit ground $V_{SS}$. Further, the gate 27 of the NMOS transistor $M_6$ is coupled by the metal contact 39 to the $V_{DD}$ power rail.

As shown in FIG. 6, the thick oxide device $M_5$ is operated in a bipolar mode, in which the first heavily-doped N-type region 14, the first P-well region 12, and the second heavily-doped N-type regions 15 respectively constitute the collector, base, and emitter of an NPN bipolar junction transistor, during an ESD event. When a positive-to-ground ESD pulse occurs at the pad 32, the voltage of the ESD pulse is coupled to the first well region 12 by the capacitor C to forward bias the junction between the first P-well region 12 and the second heavily-doped N-type region 15. Consequently, the NPN bipolar transistor is directly operated in snapback mode without causing breakdown. Therefore, the ESD stress occurring at the pad 32 bypasses the ESD current flowing from the first heavily-doped N-type region 14 to the second heavily-doped N-type regions 15 and is then discharged to circuit ground $V_{SS}$. The ESD discharge current disperses through two opposing sides of the first heavily-doped N-type region 14 shown in FIG. 6, in effect minimizing local heating of the ESD protection circuit. Moreover, the triggering voltage of the ESD protection circuit is lowered to the level of the snapback voltage but not to the level of the breakdown voltage. This turned-on voltage clamps the pad 32 to a low voltage level so that the internal circuit 6, as well as the output buffer, are protected from ESD damage.

Figure 7:
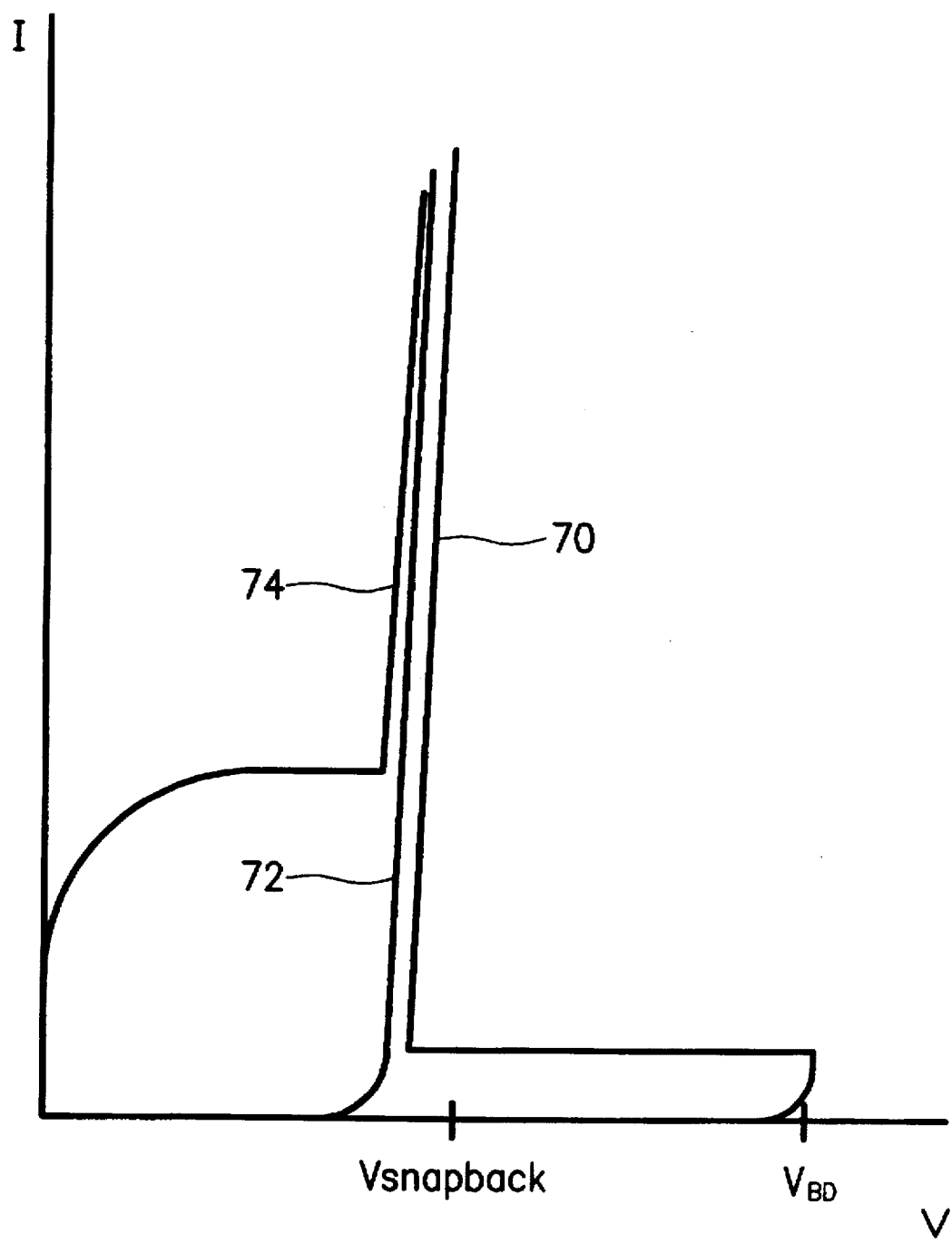
FIG. 7 depicts I–V curves of the thick oxide device with different P-well biases.

Referring to FIG. 7, I–V curves of the thick oxide device according to the invention are depicted, along with the curve of the conventional circuit for comparison. In the drawing, curve 70 corresponds to the conventional circuit, and curves 72 and 74 correspond to the circuit in accordance with the invention. It is known that the conventional circuit must break down prior to being operated in snapback mode. Therefore, the breakdown voltage $V_{BD}$ requires a triggering voltage much higher than the snapback voltage $V_{snapback}$. However, in accordance with the invention, the circuit is directly operated in snapback mode (such as shown by curve 72), without breakdown, to clamp the pad 5 or 7 to a lower voltage level during the occurrence of an ESD event. Accordingly, the protection of the internal circuit 6 and output buffer against the ESD stress is attainable. Furthermore, the bipolar transistor is first operated in a saturated mode and then enters into snapback mode (such as the curve 74) while the voltage coupled to the first well region 12 is elevated. At that time, the snapback voltage is somewhat decreased, as depicted in FIG. 7.

As shown in FIG. 6, the first well region 12 is coupled to the NMOS transistor $M_6$ and to circuit ground $V_{SS}$. At this time, the potential of the $V_{DD}$ power rail is held at an initial state (e.g., grounded), and, therefore, the first P-well region 12 is not grounded. Consequently, the turned-off NMOS transistor $M_6$ can sustain the forward bias between the P-well region 12 and the second heavily-doped N-type regions 15 during the ESD event. However, while the power rail $V_{DD}$ is powered in normal operation, the thick oxide device $M_5$ is turned off and the first well region 12 is grounded via the NMOS transistor $M_6$ and therefore will not float.

The diode $D_1$ depicted in FIG. 4, may be fabricated from another N+/P-well junction. When a negative-to-ground ESD pulse appears at the input pad 5, the diode $D_1$ is forward biased to bypass the ESD stress, thereby protecting the internal circuit 6 from ESD damage.

The diode $D_2$, as depicted in FIG. 5, can be formed by the junction between the drain and the bulk of the NMOS transistor $M_2$ of the output buffer; the connection of diode $D_2$ is therefore designated by a dashed line. When a negative-to-ground ESD pulse appears at the output pad 7, the diode $D_2$ is forward biased to bypass the ESD stress, thereby protecting the internal circuit 6 from ESD damage. Because of the existence of the ESD protection circuit, the conventional circuit technique of enlarging the spacing between the gate and the drain of the NMOS transistor $M_2$ in consideration of ESD immunity is unnecessary. Consequently, less layout area has to be allocated for the output buffer.

In conclusion, the invention utilizes an ESD protection circuit to protect an internal circuit from ESD damage. The same circuit may be used at the input pads or the output pads of the IC. Moreover, the fabrication process is compatible with CMOS fabrication techniques and does not consume extra layout area.

Alternative embodiments of the invention have now been described in detail. It is to be noted, however, that this description of these embodiments is also illustrative of the principles underlying the inventive concept. It is therefore contemplated that various modifications of the disclosed embodiments will, without departing from the spirit and scope of the invention, be apparent to persons of ordinary skill in the art, and the scope of the invention is intended to be limited only by the appended claims.

What is claimed is:

1. An electrostatic discharge protection circuit, comprising:

an N-type semiconductor substrate;

a first P-well region and a second P-well region mutually spaced apart and formed in the substrate;

at least one contact region formed in the first P-well region;

an isolating structure formed on the substrate;

a polysilicon layer formed on the isolating structure and coupled to the contact region;

a dielectric layer formed overlying the polysilicon layer;

a metal pad formed on the dielectric layer, wherein the metal pad, the dielectric layer, and the polysilicon layer form a capacitor for coupling ESD stress to the first P-well region when an ESD voltage appears at the pad;

a first heavily-doped N-type region formed in the first P-well region and coupled to the pad;

at least one second heavily-doped N-type region spaced apart from and electrically isolated from the first heavily-doped N-type region, and coupled to a circuit ground, wherein the first heavily-doped N-type region, the second heavily-doped N-type region, and the first P-well region form a bipolar junction transistor which bypasses ESD stress when an ESD voltage is coupled to the first P-well region through the capacitor; and an NMOS transistor formed in the second P-well region, the NMOS transistor having a source coupled to the circuit ground, a drain coupled to the contact region, and a gate responsive to a circuit power signal to cause the NMOS transistor to connect the first P-well region to the circuit ground.

2. The circuit as claimed in claim 1, wherein the first heavily-doped N-type region is spaced apart from the at least one second heavily-doped N-type region by the isolating structure, the isolating structure being a field oxide layer.

3. The circuit as claimed in claim 2, wherein the pad is an input pad.

4. The circuit as claimed in claim 3, further comprising a diode having an anode connected to circuit ground and a cathode connected to the input pad.

5. The circuit as claimed in claim 2, wherein the pad is an output pad.

6. The circuit as claimed in claim 5, wherein the NMOS transistor is a first NMOS transistor and the circuit further comprises an output buffer connected to the output pad, the output buffer including a second NMOS transistor configured with a source connected to circuit ground, a drain connected to the output pad, and a bulk connected to the source.

7. The circuit as claimed in claim 6, wherein a junction of the drain and the bulk of the second NMOS transistor forming a diode, the diode having an anode connected to circuit ground and a cathode connected to the output pad.

* * * * *